(12) United States Patent
Shin et al.

(10) Patent No.: US 8,106,498 B2
(45) Date of Patent: Jan. 31, 2012

(54) INTEGRATED CIRCUIT PACKAGING SYSTEM WITH A DUAL BOARD-ON-CHIP STRUCTURE AND METHOD OF MANUFACTURE THEREOF

(75) Inventors: HanGil Shin, Seongnam-si (KR); HeeJo Chi, Daejeon-si (KR); A Leam Choi, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 220 days.

(21) Appl. No.: 12/398,466

(22) Filed: Mar. 5, 2009

(65) Prior Publication Data
US 2010/0224975 A1 Sep. 9, 2010

(51) Int. Cl.
*H01L 23/02* (2006.01)
*H01L 21/98* (2006.01)

(52) U.S. Cl. ......... 257/686; 257/E23.169; 257/E21.702; 257/E23.128; 257/685; 257/777; 257/723; 257/774; 257/773

(58) Field of Classification Search .................. 257/686, 257/685, 777, 723, 774, 773, E23.169, E21.502, 257/E23.128, E21.02
See application file for complete search history.

(56) References Cited

U.S. PATENT DOCUMENTS

| | | | |
|---|---|---|---|
| 7,119,427 B2 | 10/2006 | Kim | |
| 7,190,061 B2 | 3/2007 | Lee | |
| 7,276,786 B2 | 10/2007 | Cho et al. | |
| 7,504,284 B2* | 3/2009 | Ye et al. | 438/109 |
| 7,859,120 B2* | 12/2010 | Choi et al. | 257/778 |
| 2007/0045803 A1* | 3/2007 | Ye et al. | 257/686 |
| 2009/0152701 A1* | 6/2009 | Kuan et al. | 257/686 |
| 2010/0072596 A1* | 3/2010 | Pagaila et al. | 257/686 |

* cited by examiner

*Primary Examiner* — A O Williams
(74) *Attorney, Agent, or Firm* — Mikio Ishimaru

(57) ABSTRACT

A method of manufacture of an integrated circuit packaging system includes: providing a first board-on-chip-structure having a first integrated circuit die mounted over a substrate and the substrate having a substrate cavity; mounting a second board-on-chip-structure over the first board-on-chip-structure, the second board-on-chip-structure having a second integrated circuit die mounted under an interposer and the interposer having an interposer cavity; connecting the first board-on-chip-structure to the second board-on-chip-structure with an internal interconnect; and encapsulating the first board-on-chip-structure, the second board-on-chip-structure, and the internal interconnect with an encapsulation.

20 Claims, 7 Drawing Sheets

INTEGRATED CIRCUIT PACKAGING SYSTEM WITH A DUAL BOARD-ON-CHIP STRUCTURE AND METHOD OF MANUFACTURE THEREOF

TECHNICAL FIELD

The present invention relates generally to an integrated circuit packaging system and more particularly to a system for utilizing a dual board-on-chip structure an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a first board-on-chip-structure having a first integrated circuit die mounted over a substrate and the substrate having a substrate cavity; mounting a second board-on-chip-structure over the first board-on-chip-structure, the second board-on-chip-structure having a second integrated circuit die mounted under an interposer and the interposer having an interposer cavity; connecting the first board-on-chip-structure to the second board-on-chip-structure with an internal interconnect; and encapsulating the first board-on-chip-structure, the second board-on-chip-structure, and the internal interconnect with an encapsulation.

The present invention provides an integrated circuit packaging system including: a first board-on-chip-structure having a first integrated circuit die mounted over a substrate and the substrate having a substrate cavity; a second board-on-chip-structure mounted over the first board-on-chip-structure, the second board-on-chip-structure having a second integrated circuit die mounted under an interposer and the interposer having an interposer cavity; the first board-on-chip-structure connected to the second board-on-chip-structure with an internal interconnect; and an encapsulation that encapsulates the first board-on-chip-structure, the second board-on-chip-structure, and the internal interconnect.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
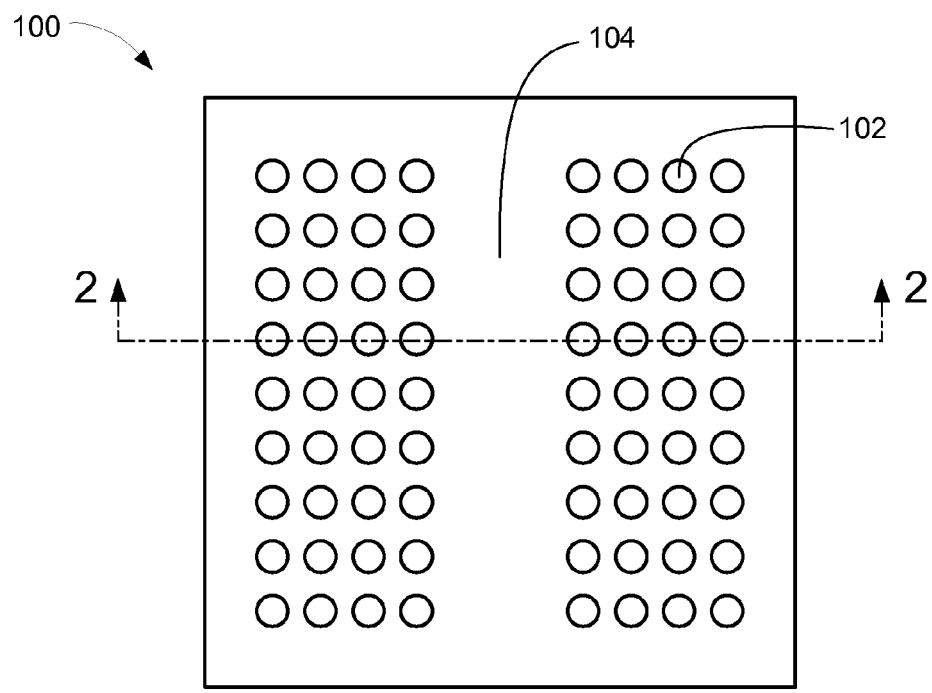
FIG. 1 is a top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 such as a dual board-on-chip package in an embodiment of the present invention. The integrated circuit packaging system 100 is shown having terminal interconnects 102 exposed from an encapsulation 104 such as a film assisted molding.

Figure 2:
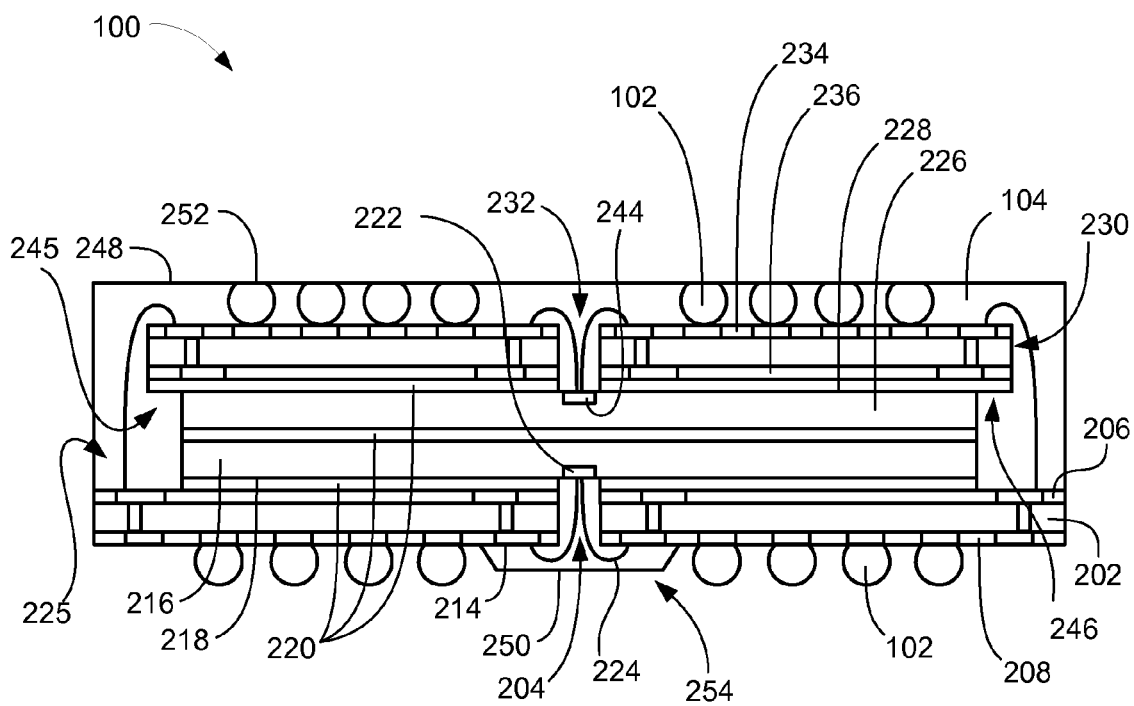
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202 such as a laminated plastic or ceramic substrate with a substrate cavity 204.

The substrate 202 has a first functional side 206 and a second functional side 208. Mounted below the second functional side 208 of the substrate 202 are the terminal interconnects 102 such as solder balls.

Mounted above the substrate 202 is a first integrated circuit die 216 such as a wire-bonded die with an active side 218. The active side 218 of the first integrated circuit die 216 is attached to the substrate 202 with a die attach adhesive 220 to create a board-on-chip-structure. The substrate cavity 204 exposes connection points 222 on the active side 218 of the first integrated circuit die 216. The connection points 222 on the first integrated circuit die 216 are connected to the second functional side 208 of the substrate 202 with internal interconnects such as bond wires 224.

The bond wires 224 connecting the active side 218 of the first integrated circuit die 216 to the substrate 202 pass through the substrate cavity 204 and bend under the substrate 202 to connect to the second functional side 208 of the substrate 202. The first integrated circuit die 216 mounted to the substrate 202 and connected with the bond wires 224 forms a first board-on-chip-structure 225.

Mounted above the first integrated circuit die 216 is a second integrated circuit die 226 such as a wire-bonded die with an active side 228. The second integrated circuit die 226 is attached to the first integrated circuit die 216 with the die attach adhesive 220.

Mounted above the second integrated circuit die 226 is an interposer 230 such as a UV stabilized woven glass and epoxy resin with etched copper conductive pathways interposer with an interposer cavity 232 and a first functional side 234 and a second functional side 236.

The term "interposer" is a term of art describing its function and placement between components within the package or between the package components and external components of a larger electronic system. The active side 228 of the second integrated circuit die 226 is attached to the interposer 230 with the die attach adhesive 220 to create a board-on-chip-structure.

The interposer cavity 232 exposes connection points 244 on the active side 228 of the second integrated circuit die 226. The connection points 244 on the second integrated circuit die 226 are connected to the first functional side 234 of the interposer 230 with the bond wires 224. The bond wires 224 pass through the interposer cavity 232 and bend over the interposer 230 to connect to the first functional side 234. The second integrated circuit die 226 mounted to the interposer 230 and connected with the bond wires 224 forms a second board-on-chip-structure 245.

The interposer 230 is connected to the substrate 202 with the bond wires 224. Mounted to the first functional side 234 of the interposer 230 are the terminal interconnects 102. The interposer 230 is larger than the second integrated circuit die 226 and creates an overhang 246.

The encapsulation 104 encapsulates the first integrated circuit die 216, the second integrated circuit die 226, the interposer 230, and the bond wires 224. The encapsulation 104, protects sensitive components from moisture, dust and other contamination.

The terminal interconnects 102 mounted to the first functional side 234 of the interposer 230 are only partially encapsulated and are exposed from the encapsulation 104 while the terminal interconnects 102 mounted to the second functional side 208 of the substrate 202 are not encapsulated by the encapsulation 104. The encapsulation 104 has a top surface 248 and a bottom surface 250.

The top surface 248 is co-planar to an exposed surface 252 on the terminal interconnects 102 mounted to the first functional side 234 of the interposer 230. The exposed surface 252 is planar. The bottom surface 250 is planar and the encapsulation forms a protrusion 254 around the bond wires 224 connecting the first integrated circuit die 216 to the substrate 202.

It has been discovered that the substrate cavity 204 and the interposer cavity 232 provide greater connection density and versatility within the integrated circuit packaging system while creating a more robust structure by fully encapsulating the bond wires 224 connecting the interposer 230 and the substrate 202.

Figure 3:
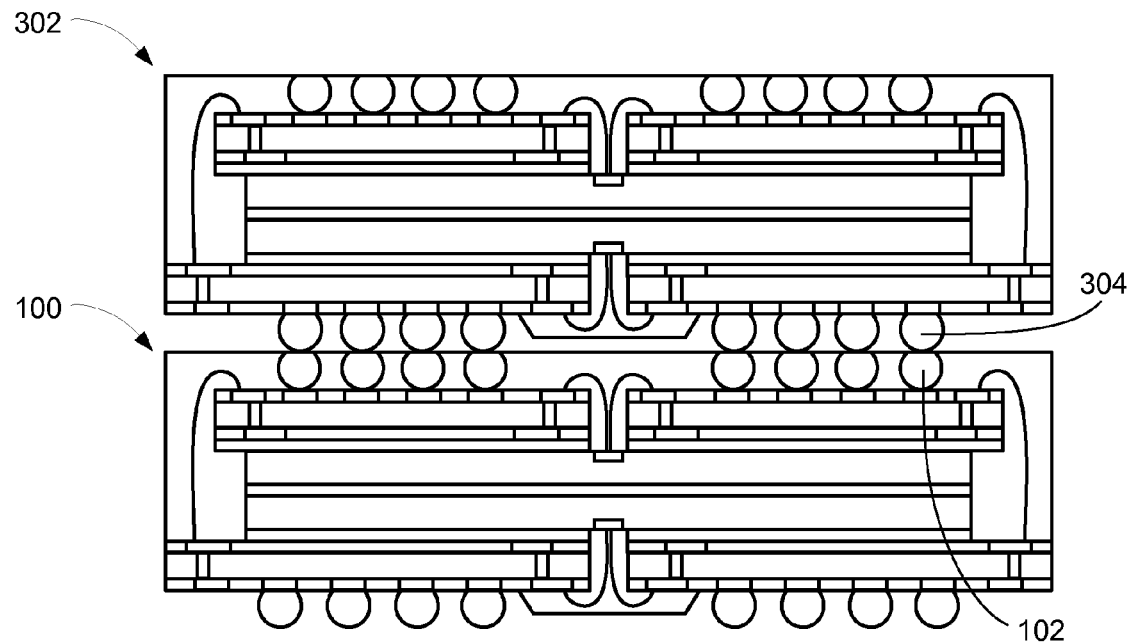
FIG. 3 is the integrated circuit packaging system of FIG. 2 after a second package mounting phase of manufacture.

Referring now to FIG. 3, therein is shown the integrated circuit packaging system 100 of FIG. 2 after a second package mounting phase of manufacture. The integrated circuit packaging system 100 is shown having a dual board-on-chip package 302 with terminal interconnects 304 which correspond to the terminal interconnects 102 mounted above the integrated circuit packaging system 100.

Figure 4:
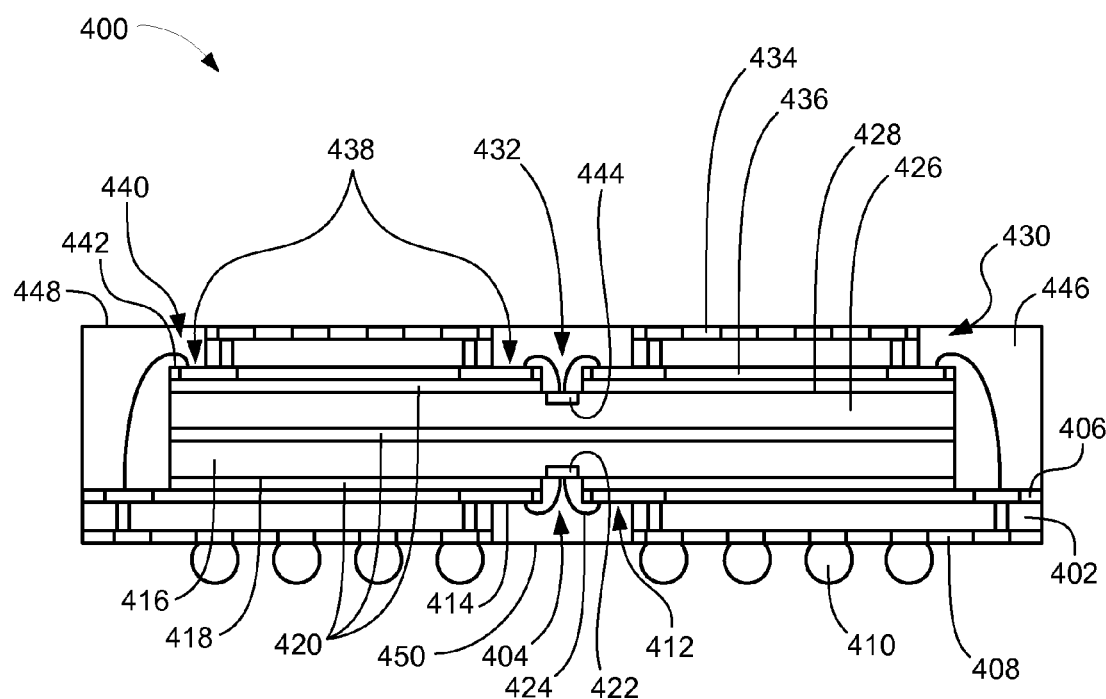
FIG. 4 is a cross-sectional view of an integrated circuit packaging system in a further embodiment of the present invention.

Referring now to FIG. 4, therein is shown a cross-sectional view of an integrated circuit packaging system 400 in a further embodiment of the present invention. The integrated circuit packaging system 400 is shown having a substrate 402 such as a laminated plastic or ceramic substrate with a substrate cavity 404.

The substrate 402 has a first functional side 406 and a second functional side 408. Mounted below the second functional side 408 of the substrate 402 are terminal interconnects 410 such as solder balls. The substrate 402 has a trenched area 412 around the substrate cavity 404. The trenched area 412 provides an electrical connection to a back side 414 of the first functional side 406 of the substrate 402.

Mounted above the substrate 402 is a first integrated circuit die 416 such as a wire-bonded die with an active side 418. The active side 418 of the first integrated circuit die 416 is attached to the substrate 402 with a die attach adhesive 420 to create a board-on-chip-structure. The substrate cavity 404 exposes connection points 422 on the active side 418 of the first integrated circuit die 416. The connection points 422 on the first integrated circuit die 416 are connected to the back side 414 of the first functional side 406 of the substrate 402 with internal interconnects such as bond wires 424.

The bond wires 424 connecting the active side 418 of the first integrated circuit die 416 to the substrate 402 pass through the substrate cavity 404 and bend in the trenched area 412 to connect to the back side 414 of the first functional side 406 of the substrate 402.

Mounted above the first integrated circuit die 416 is a second integrated circuit die 426 such as a wire-bonded die with an active side 428. The second integrated circuit die 426 is attached to the first integrated circuit die 416 with the die attach adhesive 420.

Mounted above the second integrated circuit die 426 is an interposer 430 such as a UV stabilized woven glass and epoxy resin with etched copper conductive pathways interposer with an interposer cavity 432. The active side 428 of the second integrated circuit die 426 is attached to the interposer 430 with the die attach adhesive 420 to create a board-on-chip-structure.

The interposer has a first functional side 434 and a second functional side 436. The interposer 430 has a trenched area 438 around an edge 440 and around and adjacent the interposer cavity 432. The trenched area 438 exposes a back side 442 of the second functional side 436 of the interposer 430.

The interposer cavity 432 exposes connection points 444 on the active side 428 of the second integrated circuit die 426. The connection points 444 on the second integrated circuit die 426 are connected to the back side 442 of the second functional side 436 of the interposer 430 with the bond wires 424. The bond wires 424 pass through the interposer cavity 432 and bend in the trenched area 438 around the interposer cavity 432 to connect to the second functional side 436.

The interposer 430 is connected to the substrate 402 with the bond wires 424. The bond wires 424 connecting the interposer 430 to the substrate 402 are connected to the back side 442 of the second functional side 436 exposed by the trenched area 438 around the edge 440 of the interposer 430.

An encapsulation 446 such as a film assisted molding encapsulates the first integrated circuit die 416, the second integrated circuit die 426, and the bond wires 424. The encapsulation 446, protects sensitive components from moisture, dust and other contamination.

The encapsulation 446 has a top surface 448. The first functional side 434 of the interposer 430 is exposed from the top surface 448 of the encapsulation 446. The top surface 448 is co-planar to the first functional side 434 of the interposer 430. The encapsulation 446 also has a bottom surface 450. The bottom surface 450 is co-planar to the second functional side 408 of the substrate 402.

It has been discovered that the trenched area 438 and the trenched area 412 provide the ability to create low profile wire-bond connections which enables the use of conventional flat mold chases. This reduces production and engineering costs by allowing more sophisticated integrated circuit packaging systems to be produced without retooling factories or engaging in expensive engineering design time.

Further, the low profile wire-bond connections reduce parasitic inductance which reduces high frequency data transmissions and is caused by longer bond wires. An external package 452 may be mounted above the interposer 430 and connected to the interposer with solder balls 454.

Figure 5:
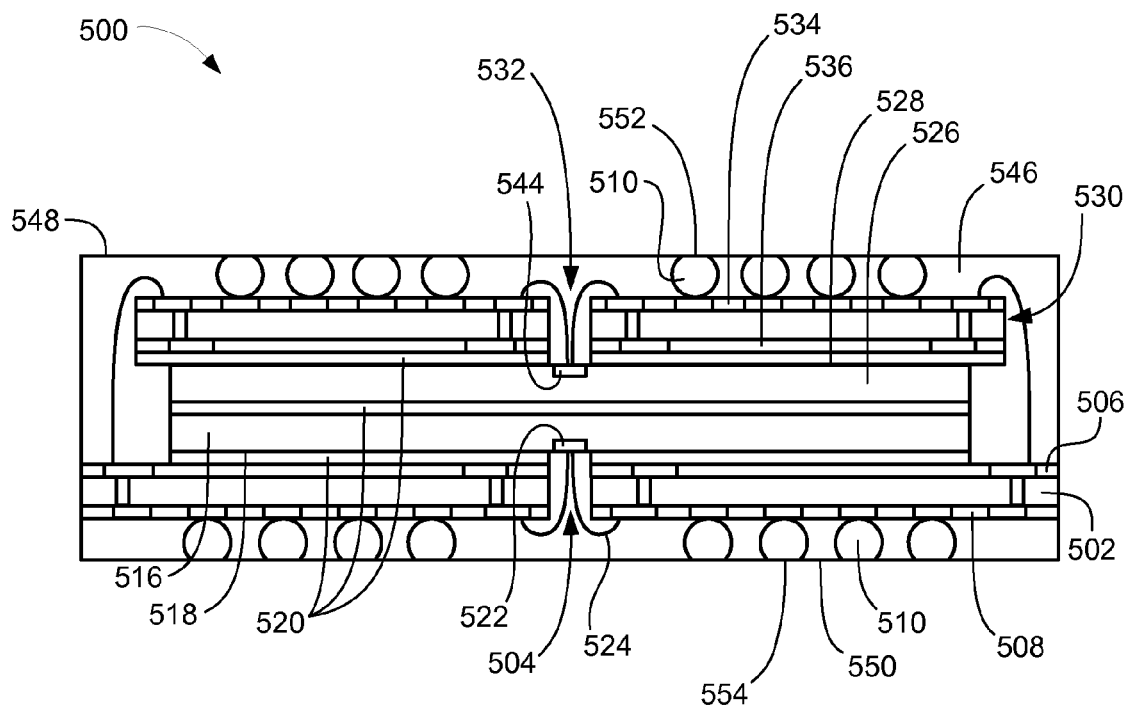
FIG. 5 is a cross-sectional view of an integrated circuit packaging system in a further embodiment of the present invention.

Referring now to FIG. 5, therein is shown a cross-sectional view of an integrated circuit packaging system 500 in a further embodiment of the present invention. The integrated circuit packaging system 500 is shown having a substrate 502 such as a laminated plastic or ceramic substrate with a substrate cavity 504.

The substrate 502 has a first functional side 506 and a second functional side 508. Mounted below the second functional side 508 of the substrate 502 are terminal interconnects 510 such as solder balls.

Mounted above the substrate 502 is a first integrated circuit die 516 such as a wire-bonded die with an active side 518. The active side 518 of the first integrated circuit die 516 is attached to the substrate 502 with a die attach adhesive 520 to create a board-on-chip-structure. The substrate cavity 504 exposes connection points 522 on the active side 518 of the first integrated circuit die 516. The connection points 522 on the first integrated circuit die 516 are connected to the second functional side 508 of the substrate 502 with internal interconnects such as bond wires 524.

The bond wires 524 connecting the active side 518 of the first integrated circuit die 516 to the substrate 502 pass through the substrate cavity 504 and bend under the substrate 502 to connect to the second functional side 508 of the substrate 502.

Mounted above the first integrated circuit die 516 is a second integrated circuit die 526 such as a wire-bonded die with an active side 528. The second integrated circuit die 526 is attached to the first integrated circuit die 516 with the die attach adhesive 520.

Mounted above the second integrated circuit die 526 is an interposer 530 such as a UV stabilized woven glass and epoxy resin with etched copper conductive pathways interposer with an interposer cavity 532 and a first functional side 534 and a second functional side 536. The active side 528 of the second integrated circuit die 526 is attached to the interposer 530 with the die attach adhesive 520 to create a board-on-chip-structure.

The interposer cavity 532 exposes connection points 544 on the active side 528 of the second integrated circuit die 526. The connection points 544 on the second integrated circuit die 526 are connected to the first functional side 434 of the interposer 530 with the bond wires 524. The bond wires 524 pass through the interposer cavity 532 and bend over the interposer 530 to connect to the first functional side 534.

The interposer 530 is connected to the substrate 502 with the bond wires 524. Mounted to the first functional side 534 of the interposer 530 are the terminal interconnects 5 10. An encapsulation 546 such as a film assisted molding encapsulates the first integrated circuit die 516, the second integrated circuit die 526, the interposer 530, and the bond wires 524. The encapsulation 546, protects sensitive components from moisture, dust and other contamination.

The terminal interconnects 510 mounted to the first functional side 534 of the interposer 530 and the terminal interconnects 510 mounted to the second functional side 508 of the substrate 502 are partially encapsulated and exposed from the encapsulation 546. The encapsulation 546 has a top surface 548 and a bottom surface 550. The top surface 548 is planar to an exposed surface 552 on the terminal interconnects 510 mounted to the first functional side 534 of the interposer 530. The bottom surface 550 is planar to an exposed surface 554 on the terminal interconnects 510 mounted to the second functional side 508 of the substrate 502. The exposed surface 552 and the exposed surface 554 of the terminal interconnects 510 are planar.

It has been discovered that the substrate cavity 504 and the interposer cavity 432 provide greater connection density and versatility within the integrated circuit packaging system while creating a more robust structure by fully encapsulating the bond wires 524 connecting the interposer 530 and the substrate 502.

Figure 6:
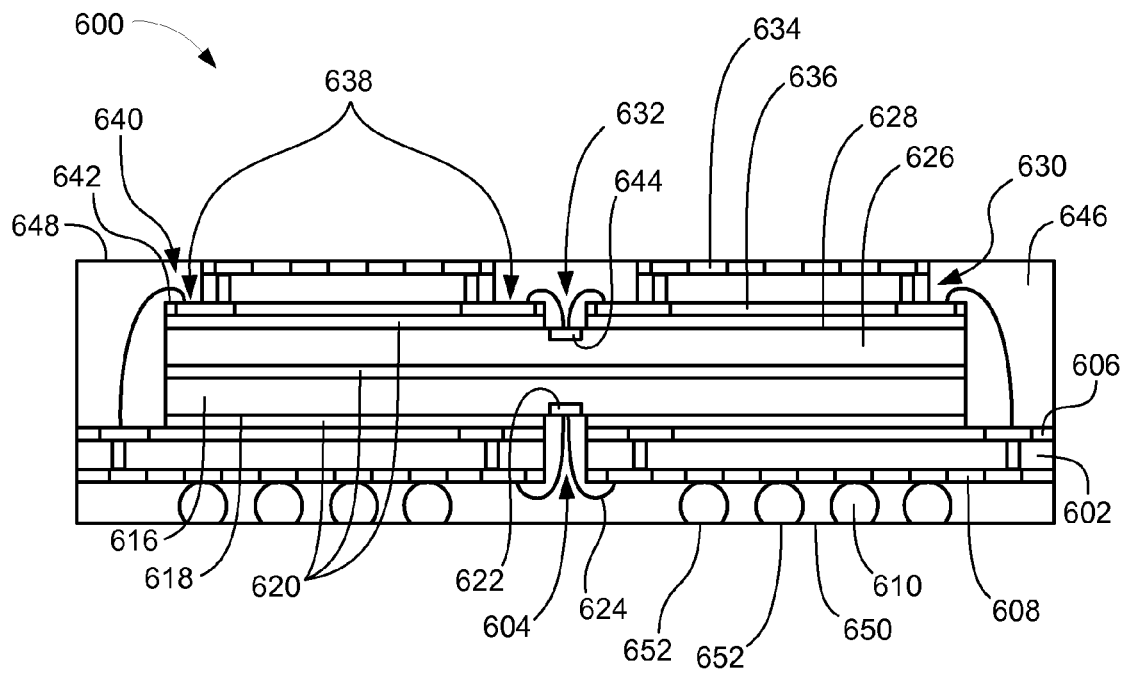
FIG. 6 is a cross-sectional view of an integrated circuit packaging system in a further embodiment of the present invention.

Referring now to FIG. 6, therein is shown a cross-sectional view of an integrated circuit packaging system 600 in a further embodiment of the present invention. The integrated circuit packaging system 600 is shown having a substrate 602 such as a laminated plastic or ceramic substrate with a substrate cavity 604.

The substrate 602 has a first functional side 606 and a second functional side 608. Mounted below the second functional side 608 of the substrate 602 are terminal interconnects 610 such as solder balls.

Mounted above the substrate 602 is a first integrated circuit die 616 such as a wire-bonded die with an active side 618. The active side 618 of the first integrated circuit die 616 is attached to the substrate 602 with a die attach adhesive 620 to create a board-on-chip-structure. The substrate cavity 604 exposes connection points 622 on the active side 618 of the first integrated circuit die 616. The connection points 622 on the first integrated circuit die 616 are connected to the second functional side 608 of the substrate 602 with internal interconnects such as bond wires 624.

The bond wires 624 connecting the active side 618 of the first integrated circuit die 616 to the substrate 602 pass through the substrate cavity 604 and bend under the substrate 602 to connect to the second functional side 608 of the substrate 602.

Mounted above the first integrated circuit die 616 is a second integrated circuit die 626 such as a wire-bonded die with an active side 628. The second integrated circuit die 626 is attached to the first integrated circuit die 616 with the die attach adhesive 620.

Mounted above the second integrated circuit die 626 is an interposer 630 such as a UV stabilized woven glass and epoxy resin with etched copper conductive pathways interposer with an interposer cavity 632. The active side 628 of the second integrated circuit die 626 is attached to the interposer 630 with the die attach adhesive 620 to create a board-on-chip-structure.

The interposer has a first functional side 634 and a second functional side 636. The interposer 630 has a trenched area 638 around an edge 640 and around the interposer cavity 632. The trenched area 638 exposes a back side 642 of the second functional side 636 of the interposer 630.

The interposer cavity 632 exposes connection points 644 on the active side 628 of the second integrated circuit die 626. The connection points 644 on the second integrated circuit die 626 are connected to the back side 642 of the second functional side 636 of the interposer 630 with the bond wires 624. The bond wires 624 pass through the interposer cavity 632 and bend in the trenched area 638 around the interposer cavity 632 to connect to the second functional side 636.

The interposer 630 is connected to the substrate 602 with the bond wires 624. The bond wires 624 connecting the interposer 630 to the substrate 602 are connected to the back side 642 of the second functional side 636 exposed by the trenched area 638 around the edge 640 of the interposer 630.

An encapsulation 646 such as a film assisted molding encapsulates the first integrated circuit die 616, the second integrated circuit die 626, and the bond wires 624. The encapsulation 646, protects sensitive components from moisture, dust and other contamination.

The encapsulation 646 has a top surface 648. The first functional side 634 of the interposer 630 is exposed from the top surface 648 of the encapsulation 646. The top surface 648 is co-planar to the first functional side 634 of the interposer 630. The encapsulation 646 also has a bottom surface 650. The bottom surface 650 is planar to an exposed surface 652 on the terminal interconnects 610 mounted to the second functional side 608 of the substrate 602.

It has been discovered that the trenched area 638 provides the ability to create low profile wire-bond connections which enables the use of conventional flat mold chases. This reduces production and engineering costs by allowing more sophisticated integrated circuit packaging systems to be produced without retooling factories or engaging in expensive engineering design time.

Further, the low profile wire-bond connections reduce parasitic inductance which reduces high frequency data transmissions and is caused by longer bond wires. Finally, external passive components 654 such as capacitors, resistors, and inductors may be mounted above the interposer 630.

Figure 7A:
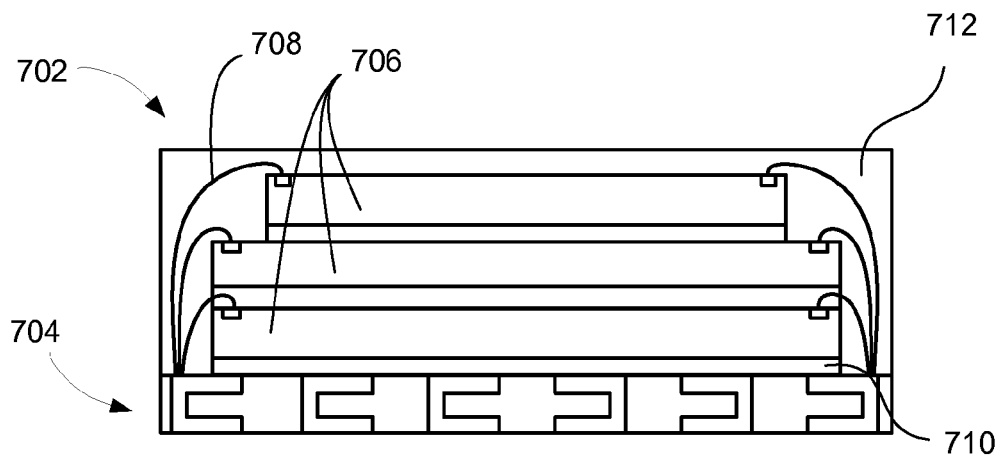
FIGS. 7A-E are cross-sectional views of external electric components for an embodiment of the present invention.

Referring now to FIG. 7A, therein is shown a cross-sectional view of an external electric component such as an array package 702 having a substrate 704 with multiple integrated circuit dies 706 stacked above the substrate 704. The multiple integrated circuit dies 706 are connected to the substrate 704 with interconnects such as bond wires 708. The multiple integrated circuit dies 706 are attached with a die attach adhesive 710. An encapsulation 712 such as a film assisted molding encapsulates the multiple integrated circuit dies 706 and the bond wires 708.

Figure 7B:
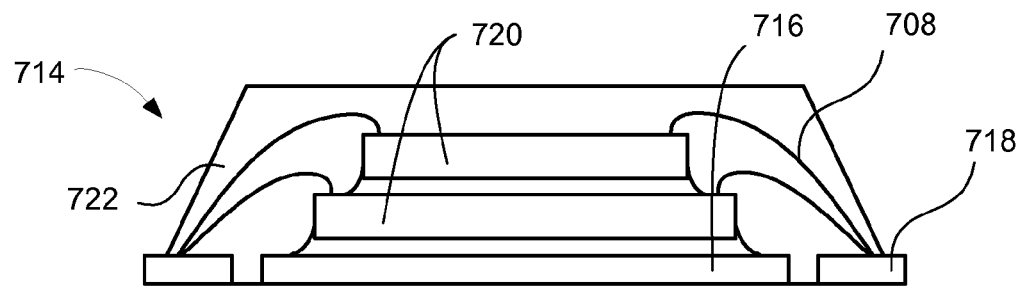

Referring now to FIG. 7B, therein is shown a cross-sectional view of an external electric component such as a quad-flatpak-no-leads (QFN) 714 having a die pad 716 and bond-fingers 718. Stacked above the die pad 716 are multiple integrated circuit dies 720 attached with the die attach adhesive 710. The multiple integrated circuit dies 720 are connected to the bond fingers 718 with the bond wires 708. The multiple integrated circuit dies 720 and the bond wires 708 are encapsulated in an encapsulation 722 such as a film assisted molding.

Figure 7C:
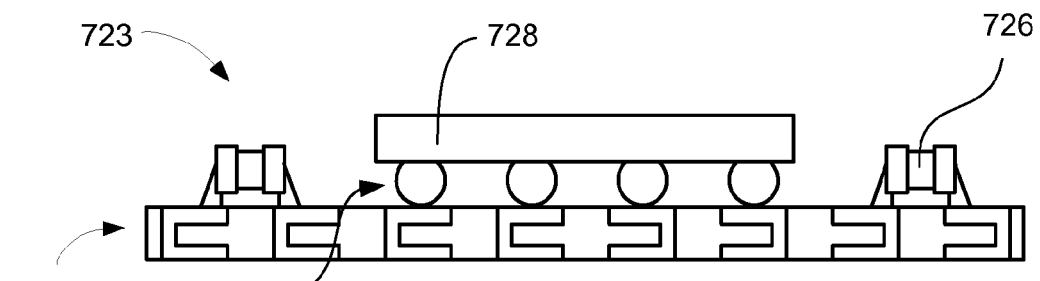

Referring now to FIG. 7C, therein is shown a cross-sectional view of an external electric component such as a compound circuit 723 having a substrate 724. Above the substrate 724 passive components 726 such as resistors, capacitors, and inductors are mounted peripheral to an integrated circuit 728 such as a flip chip. The integrated circuit 728 is connected to the substrate 724 with interconnects such as solder bumps 730.

Figure 7D:
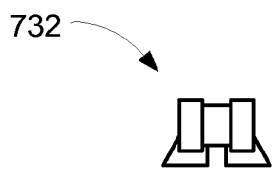

Referring now to FIG. 7D, therein is shown a cross-sectional view of an external electric component such as a passive component 732 such as a resistor, capacitor, or inductor.

Figure 7E:
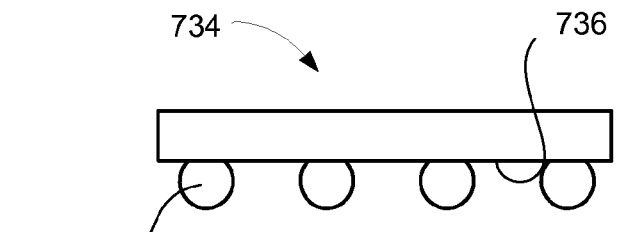

Referring now to FIG. 7E, therein is shown a cross-sectional view of an external electric component such as an integrated circuit die 734 such as a flip chip. The integrated circuit die 734 is shown having an active side 736 with interconnects 738 such as solder bumps mounted below.

Figure 8A:
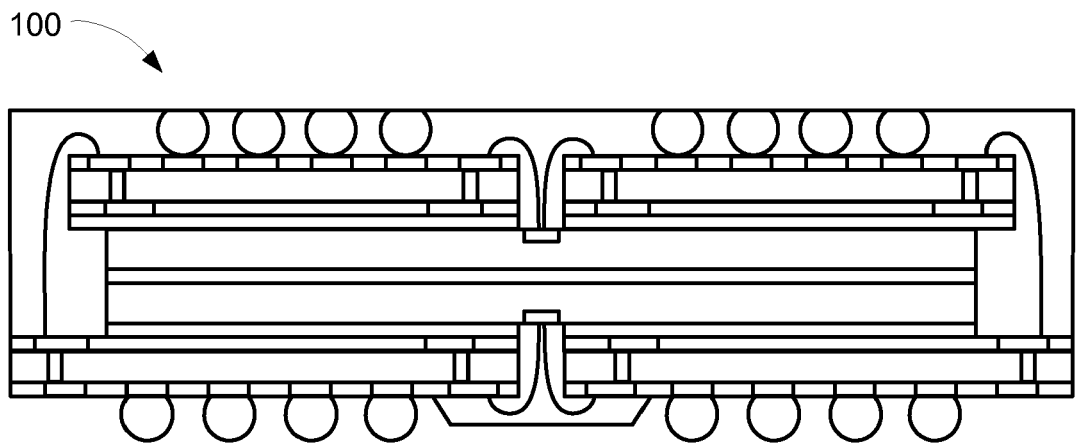
FIG. 8A is the integrated circuit packaging system of FIG. 1.

Referring now to FIG. 8A, therein is shown the integrated circuit packaging system 100 of FIG. 1.

Figure 8B:
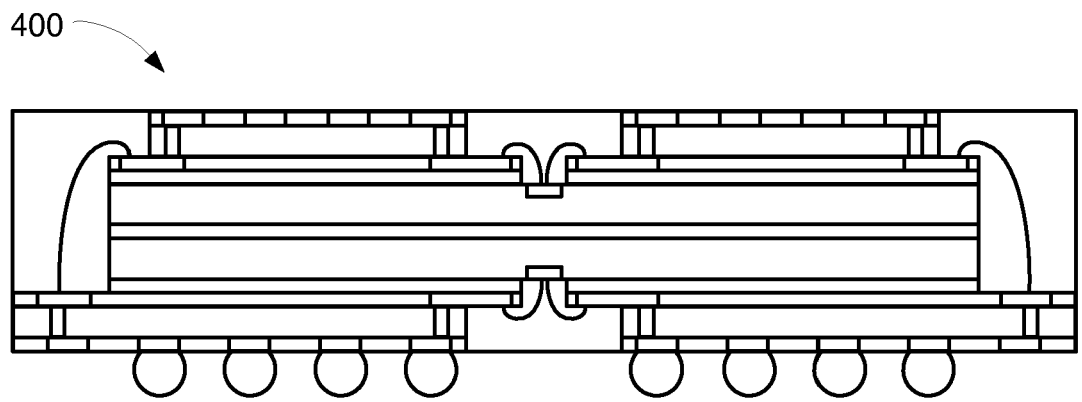
FIG. 8B is the integrated circuit packaging system of FIG. 4.

Referring now to FIG. 8B, therein is shown the integrated circuit packaging system 400 of FIG. 4.

Figure 8C:
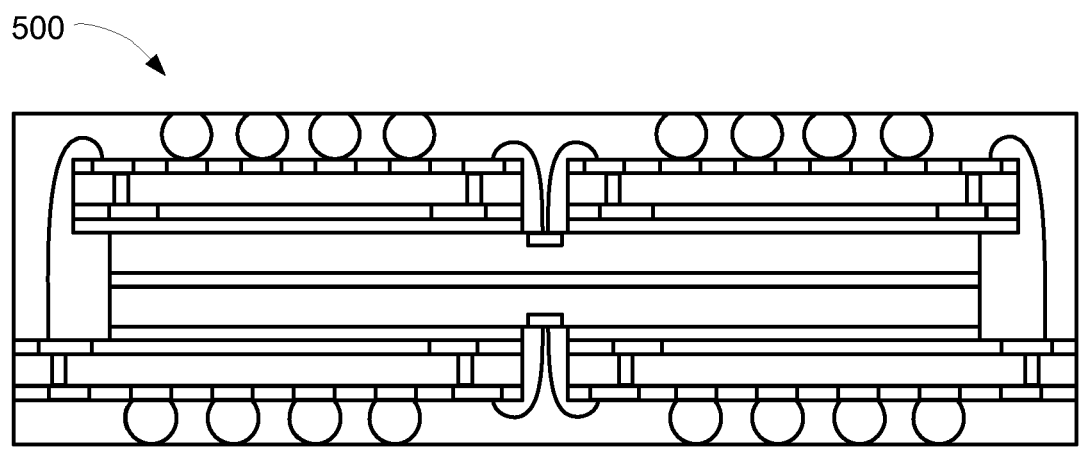
FIG. 8C is the integrated circuit packaging system of FIG. 5.

Referring now to FIG. 8C, therein is shown the integrated circuit packaging system 500 of FIG. 5.

Figure 8D:
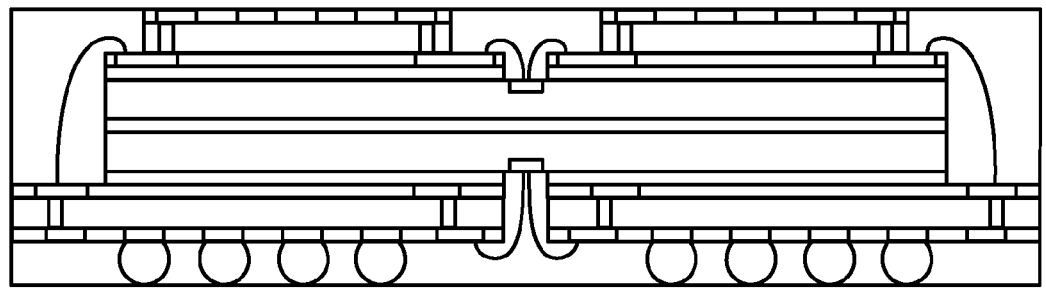
FIG. 8D is the integrated circuit packaging system of FIG. 6.

Referring now to FIG. 8D, therein is shown the integrated circuit packaging system 600 of FIG. 6.

Figure 9A:
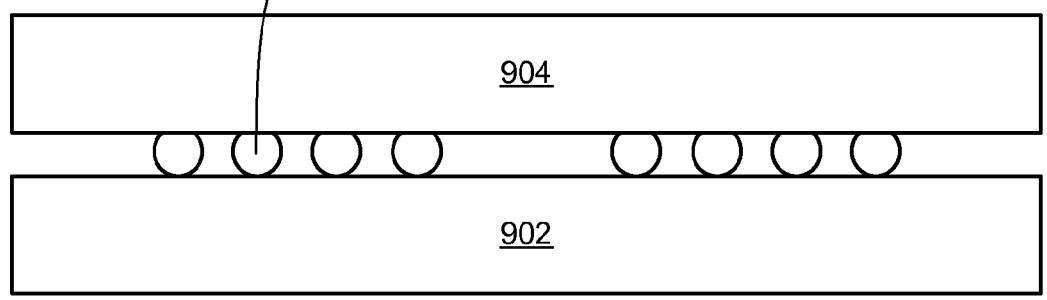
FIG. 9A is a diagram of a further embodiment of the present invention.

Referring now to FIG. 9A, therein is shown a diagram 900 of a further embodiment of the present invention. The diagram 900 is shown having any one of the integrated circuit packaging systems from FIGS. 8A-D in a block 902 with any one of the external electric components from FIGS. 7A-E in a block 904 and mounted above the block 902. The block 904 is shown connected to the block 902 with interconnects such as solder bumps 906.

Figure 9B:
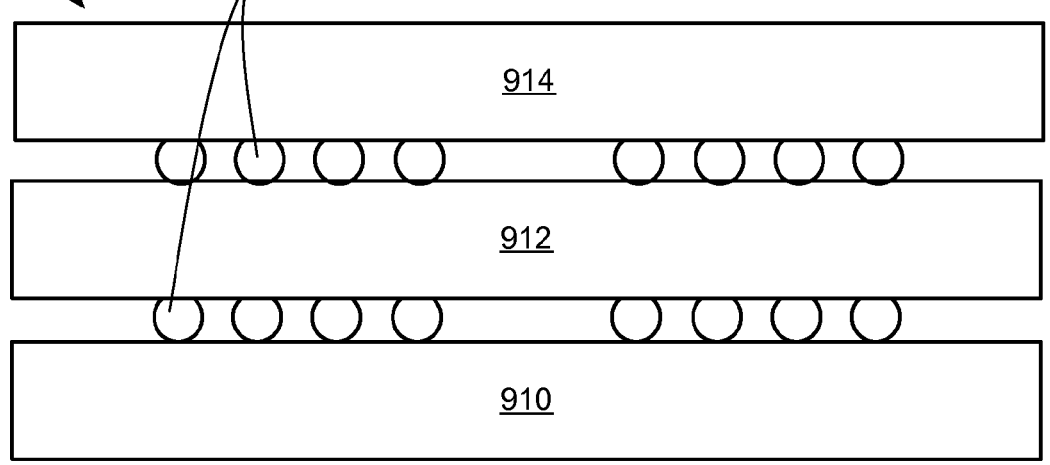
FIG. 9B is a diagram of a further embodiment of the present invention.

Referring now to FIG. 9B, therein is shown a diagram 908 of a further embodiment of the present invention. The diagram 908 is shown having any one of the integrated circuit packaging systems from FIGS. 8A-D in a block 910 with any one of the integrated circuit packaging systems from FIGS. 8A-D in a block 912 and mounted above the block 910. Mounted above the block 912 is any one of the external electric components from FIGS. 7A-E in a block 914. The block 914 is connected to the block 912 with the solder bumps 906. The block 912 is connected to the block 910 with the solder bumps 906.

Figure 9C:
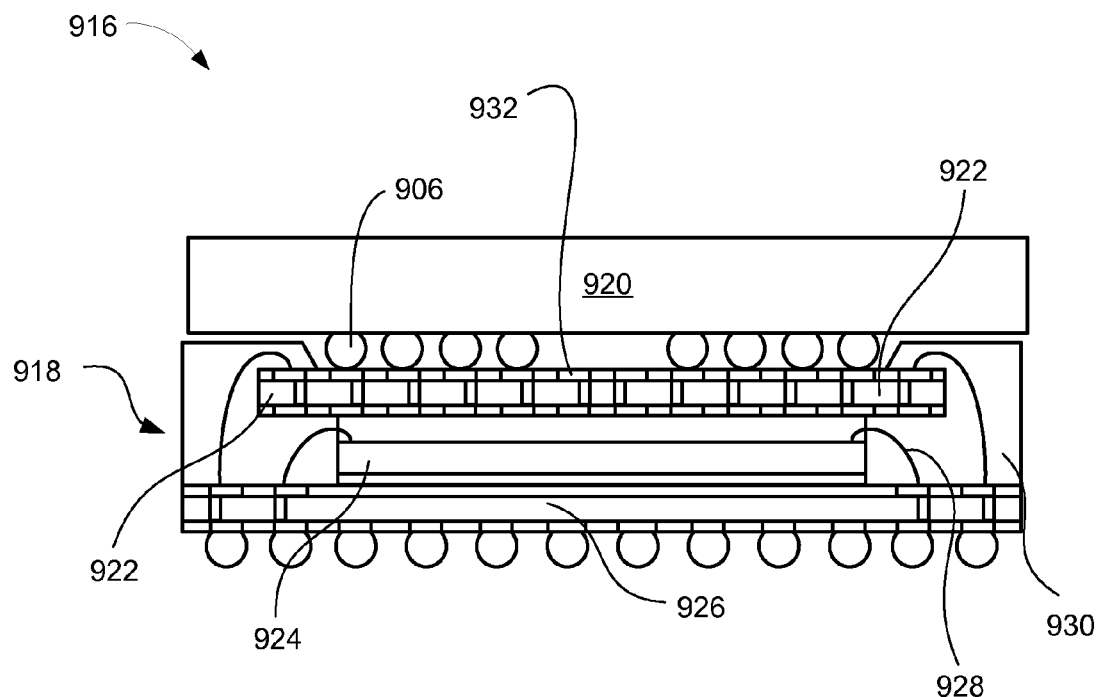
FIG. 9C is a semi-diagram of a further embodiment of the present invention.

Referring now to FIG. 9C, therein is shown a semi-diagram 916 of a further embodiment of the present invention. The semi-diagram 916 is shown having a fan-in package 918 with any one of the integrated circuit packaging systems from FIGS. 8A-D in a block 920. The block 920 is mounted to an interposer 922 on the fan-in package 918 and connected with the solder bumps 906.

The interposer 922 is mounted above an integrated circuit die 924 and a substrate 926. The integrated circuit die 924 is connected to the substrate 926 with interconnects such as bond wires 928. The bond wires 928 also connect the interposer 922 to the substrate 926. An encapsulation 930 encapsulates the bond wires 928 and partially encapsulates the interposer 922 leaving exposed connection pads 932 which allow a higher density I/O connection capacity.

Figure 10:
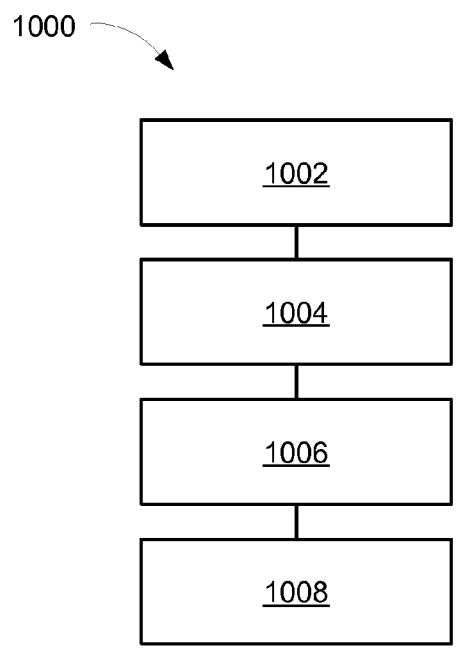
FIG. 10 is a flow chart of a method of manufacture of an integrated circuit packaging system in a further embodiment of the present invention.

Referring now to FIG. 10, therein is shown a flow chart of a method 1000 of manufacture of an integrated circuit packaging system 100 of FIG. 1 in a further embodiment of the present invention. The method 1000 includes providing a first board-on-chip-structure having a first integrated circuit die mounted over a substrate and the substrate having a substrate cavity in a block 1002; mounting a second board-on-chip-structure over the first board-on-chip-structure, the second board-on-chip-structure having a second integrated circuit die mounted under an interposer and the interposer having an interposer cavity in a block 1004; connecting the first board-on-chip-structure to the second board-on-chip-structure with an internal interconnect in a block 1006; and encapsulating the first board-on-chip-structure, the second board-on-chip-structure, and the internal interconnect with an encapsulation in a block 1008.

Thus, it has been discovered that the dual board-on-chip-structure of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a first hoard-on-chip-structure having a first integrated circuit die mounted over a substrate and the substrate having a substrate cavity;
    mounting a second board-on-chip-structure over the first board-on-chip-structure, the second board-on-chip-structure having a second integrated circuit die mounted under an interposer and the interposer having an interposer cavity and having a first trenched area adjacent to the cavity providing an electrical connection to a back side of a first functional side of the interposer;
    connecting the first board-on-chip-structure to the second board-on-chip-structure with an internal interconnect; and
    encapsulating the first board-on-chip-structure, the second board-on-chip-structure, and the internal interconnect with an encapsulation.

2. The method as claimed in claim 1 further comprising:
    connecting the first integrated circuit die to the substrate through the substrate cavity with the internal interconnects;
    connecting the second integrated circuit die to the interposer through the interposer cavity with the internal interconnects; or
    connecting a combination thereof.

3. The method as claimed in claim 1 wherein:
    providing the first board-on-chip-structure includes providing a second trenched area around the substrate cavity.

4. The method as claimed in claim 1 wherein:
mounting the second board-on-chip-structure includes providing the first trenched area around the interposer cavity, around an edge of the interposer or a combination thereof.

5. The method as claimed in claim 1 further comprising:
connecting the first integrated circuit die to the substrate through the substrate cavity with the internal interconnects; and
forming a protrusion around the internal interconnects connecting the first integrated circuit die to the substrate.

6. A method of manufacture of an integrated circuit packaging system comprising:
providing a first board-on-chip-structure having a first integrated circuit die mounted over a substrate and the substrate having a substrate cavity;
mounting a second board-on-chip-structure having a second integrated circuit die mounted under an interposer and the interposer having an interposer cavity and having a first trenched area adjacent to the cavity providing an electrical connection to a back side of a first functional side of the interposer;
connecting the first board-on-chip-structure to the second board-on-chip-structure with an internal interconnect;
forming terminal interconnects below the substrate, above the interposer, or a combination there of; and
encapsulating the first board-on-chip-structure, the second board-on-chip-structure, and the internal interconnect with an encapsulation.

7. The method as claimed in claim 6 further comprising:
mounting an array package, a quad-flatpak-no-leads, a compound circuit, a passive component, an integrated circuit die, or a combination thereof.

8. The method as claimed in claim 6 wherein:
encapsulating the second board-on-chip-structure includes leaving a first functional side of the interposer exposed from a top surface of the encapsulation.

9. The method as claimed in claim 6 further comprising:
connecting a dual board-on-chip package above the second board-on-chip-structure.

10. The method as claimed in claim 6 wherein:
encapsulating includes partially encapsulating the terminal interconnects below the substrate, above the interposer, or a combination thereof with the encapsulation.

11. An integrated circuit packaging system comprising:
a first board-on-chip-structure having a first integrated circuit die mounted over a substrate and the substrate having a substrate cavity;
a second board-on-chip-structure mounted over the first board-on-chip-structure, the second board-on-chip-structure having a second integrated circuit die mounted under an interposer and the interposer having an interposer cavity and having a first trenched area adjacent to the cavity providing an electrical connection to a back side of a first functional side of the interposer;
the first board-on-chip-structure connected to the second board-on-chip-structure with an internal interconnect; and
an encapsulation that encapsulates the first board-on-chip-structure, the second board-on-chip-structure, and the internal interconnect.

12. The system as claimed in claim 11 wherein:
the first integrated circuit die is connected to the substrate through the substrate cavity with the internal interconnects;
the second integrated circuit die is connected to the interposer through the interposer cavity with the internal interconnects; or
a combination thereof.

13. The system as claimed in claim 11 wherein:
the first board-on-chip-structure includes a second trenched area around the substrate cavity.

14. The system as claimed in claim 11 wherein:
the second board-on-chip-structure includes the first trenched area around the interposer cavity, around an edge of the interposer or a combination thereof.

15. The system as claimed in claim 11 wherein:
the first integrated circuit die is connected to the substrate through the substrate cavity with the internal interconnects; and
further comprising:
a protrusion around the internal interconnects connecting the first integrated circuit die to the substrate.

16. The system as claimed in claim 11 further comprising:
terminal interconnects formed below the substrate, formed above the interposer, or a combination thereof.

17. The system as claimed in claim 16 further comprising:
an array package, a quad-flatpak-no-leads, a compound circuit, a passive component, an integrated circuit die, or a combination thereof mounted above the second board-on-chip-structure.

18. The system as claimed in claim 16 further comprising:
a first functional side of the interposer exposed from a top surface of the encapsulation.

19. The system as claimed in claim 16 further comprising:
a dual board-on-chip package connected above the second board-on-chip-structure.

20. The system as claimed in claim 16 wherein:
the terminal interconnects below the substrate, above the interposer, or a combination thereof are partially encapsulated with the encapsulation.

* * * * *

UNITED STATES PATENT AND TRADEMARK OFFICE
CERTIFICATE OF CORRECTION

| | | |
|---|---|---|
| PATENT NO. | : 8,106,498 B2 | Page 1 of 1 |
| APPLICATION NO. | : 12/398466 | |
| DATED | : January 31, 2012 | |
| INVENTOR(S) | : Shin et al. | |

It is certified that error appears in the above-identified patent and that said Letters Patent is hereby corrected as shown below:

Column 7:
lines 18-19, delete "terminal interconnects 5 10. An encapsulation" and insert therefor --terminal interconnects 510. An encapsulation--

Column 10:
claim 1, line 40, delete "a first hoard-on-chip-structure" and insert therefor --a first board-on-chip-structure--

Signed and Sealed this
Twenty-fifth Day of September, 2012

David J. Kappos
*Director of the United States Patent and Trademark Office*